(12) United States Patent
Olzak

(10) Patent No.: US 8,758,849 B2
(45) Date of Patent: Jun. 24, 2014

(54) METHOD OF DEPOSITING ELECTRICALLY CONDUCTIVE MATERIAL ONTO A SUBSTRATE

(75) Inventor: James M. Olzak, Woodville, OH (US)

(73) Assignee: Francis C. Dlubak, Kittanning, PA (US)

( * ) Notice: Subject to any disclaimer, the term of this patent is extended or adjusted under 35 U.S.C. 154(b) by 276 days.

(21) Appl. No.: 12/671,751

(22) PCT Filed: Jul. 30, 2008

(86) PCT No.: PCT/US2008/701516
§ 371 (c)(1),
(2), (4) Date: Feb. 2, 2010

(87) PCT Pub. No.: WO2009/020804
PCT Pub. Date: Feb. 12, 2009

(65) Prior Publication Data
US 2011/0236566 A1    Sep. 29, 2011

Related U.S. Application Data

(60) Provisional application No. 60/963,640, filed on Aug. 6, 2007.

(51) Int. Cl.
| B05D 1/12 | (2006.01) |
| B05D 5/12 | (2006.01) |
| B05D 1/38 | (2006.01) |
| H05K 3/14 | (2006.01) |
| C23C 24/04 | (2006.01) |

(52) U.S. Cl.
CPC ........ C23C 24/04 (2013.01); *H05K 2203/1344* (2013.01); H05K 3/14 (2013.01)
USPC ......... 427/126.2; 427/202; 427/205; 427/427

(58) Field of Classification Search
USPC ............................. 427/126.2, 202, 205, 427
See application file for complete search history.

(56) References Cited

U.S. PATENT DOCUMENTS

| 5,302,414 | A | * | 4/1994 | Alkhimov et al. ............ 427/192 |
| 6,139,913 | A | | 10/2000 | Van Steenkiste et al. |
| 6,283,386 | B1 | | 9/2001 | Van Steenkiste et al. |
| 6,291,012 | B1 | * | 9/2001 | Miyasaka ..................... 427/191 |
| 6,402,050 | B1 | | 6/2002 | Kashirin et al. |
| 6,569,245 | B2 | | 5/2003 | Krysa et al. |
| 6,576,861 | B2 | | 6/2003 | Sampath et al. |
| 6,723,379 | B2 | * | 4/2004 | Stark ............................. 427/180 |
| 6,756,083 | B2 | | 6/2004 | Holmqvist et al. |
| 6,759,085 | B2 | | 7/2004 | Muehlberger |
| 6,762,396 | B2 | | 7/2004 | Abbott et al. |
| 6,811,812 | B2 | | 11/2004 | Van Steenkiste |
| 6,892,954 | B2 | | 5/2005 | Srinivasan |

(Continued)

FOREIGN PATENT DOCUMENTS

JP    JR2006-179856 A    6/2006

*Primary Examiner* — Frederick Parker
(74) *Attorney, Agent, or Firm* — Alan G. Towner, Esq.; Pietragallo Gordon Alfano Bosick & Raspanti, LLP

(57) ABSTRACT

A method of depositing electrically conductive material onto a dielectric substrate is provided. The method includes the steps of providing a dielectric substrate and depositing electrically conductive material onto the dielectric substrate using a cold spray gas dynamic process, wherein the cold spray gas dynamic process accelerates the electrically conductive material to a supersonic velocity.

23 Claims, 6 Drawing Sheets

(56) References Cited

U.S. PATENT DOCUMENTS

| | | |
|---|---|---|
| 6,963,044 B2 | 11/2005 | Fusaro, Jr. et al. |
| 7,002,115 B2 | 2/2006 | Gerhardinger et al. |
| 7,026,577 B2 | 4/2006 | Maeuser et al. |
| 7,039,304 B2 | 5/2006 | Gerhardinger et al. |
| 7,053,343 B2 | 5/2006 | Gerhardinger et al. |
| 7,161,117 B2 | 1/2007 | Minowa et al. |
| 7,186,952 B2 | 3/2007 | Degand et al. |
| 7,208,193 B2 | 4/2007 | Gambino et al. |
| 2003/0129576 A1* | 7/2003 | Wood et al. .................. 434/362 |
| 2004/0232117 A1 | 11/2004 | Gerhardinger et al. |
| 2005/0211799 A1* | 9/2005 | Van Steenkiste .......... 239/416.5 |
| 2006/0108601 A1* | 5/2006 | Okamoto ...................... 257/177 |
| 2006/0201932 A1 | 9/2006 | Degand et al. |

\* cited by examiner

METHOD OF DEPOSITING ELECTRICALLY CONDUCTIVE MATERIAL ONTO A SUBSTRATE

CROSS REFERENCE TO RELATED APPLICATIONS

Applicants claim priority to U.S. Provisional Patent Application Ser. No. 60/963,640 filed Aug. 6, 2007.

TECHNICAL FIELD

The invention relates generally to a method of depositing electrically conductive materials onto substrates. More specifically, the invention is directed to a method of depositing electrically conductive materials onto substrates using a cold spray process.

BACKGROUND OF THE INVENTION

Electrically conductive materials deposited on dielectric substrates have been used to manufacture a variety of articles requiring the flow of electrical current.

As one example, a dielectric substrate can be coated with an electrically conductive, heat-producing, thin-film to provide a heated substrate panel assembly. Electrical power is supplied to the film through the use of electrical conductors deposited onto the dielectric substrate and in electrical contact with the film. The substrate panels are heated when electrical current flows through the electrically conductive thin-film coating. The conductors can be electrically joined with the thin-film coating by several methods, including for example adhesion of conductive metal ribbons, deposition of metal-based paste, screen printing over the thin-film coating and deposition of metallic, electrically-conductive powders or materials directly over the thin-film coating.

Deposition of electrically conductive materials on dielectric substrates typically involves thermal spray processes such as flame spray or electrical wire arc. These methods involve injection of molten particles of metals and mixtures of metals with other materials into a high velocity gas stream so as to produce an electrically conductive deposit. The high velocity gas stream is typically directed through a mask mechanism to form a uniformly shaped electrical conductor. It would be advantageous to improve the process of forming electrical conductors onto dielectric substrates.

SUMMARY OF THE INVENTION

According to this invention there is provided a method of depositing electrically conductive material onto a dielectric substrate. The method includes the steps of providing a dielectric substrate and depositing the electrically conductive material onto the dielectric substrate using a cold spray gas dynamic process, wherein the cold spray gas dynamic process accelerates the electrically conductive material to a supersonic velocity.

According to this invention there is provided a method of manufacturing a heated substrate panel assembly. The method includes the steps of providing a dielectric substrate, applying a coated layer to the dielectric substrate and depositing opposing electrical conductors onto the coated layer by using a cold spray gas dynamic process, the opposing electrical conductors creating a heating zone therebetween and being electrically conductive with the coated layer.

DETAILED DESCRIPTION OF THE INVENTION

Figure 1:
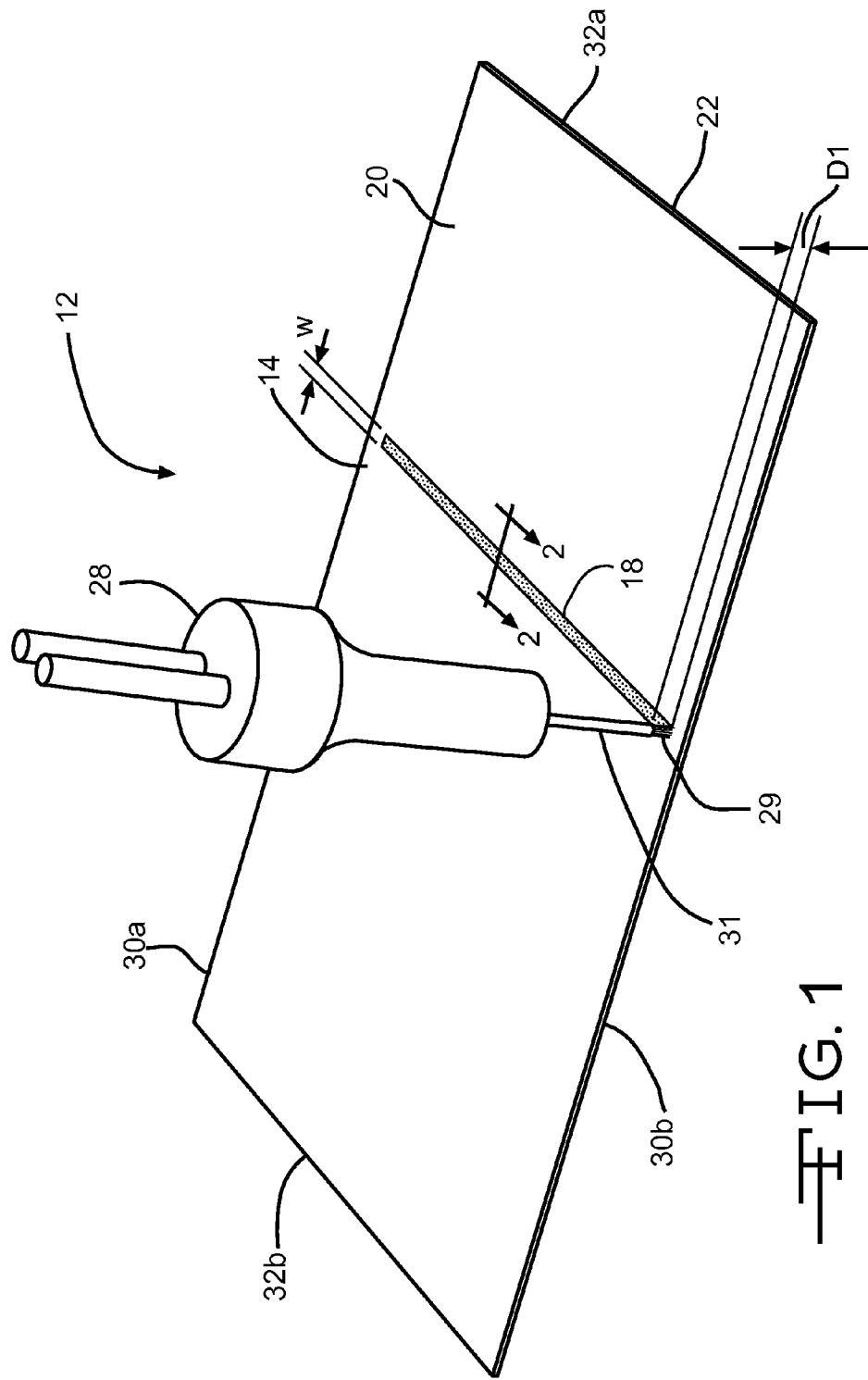
FIG. 1 is a front perspective view of conductive material deposited on a dielectric substrate according to the invention.

Referring to FIG. 1, a substrate assembly, indicated generally at 12, is shown having a dielectric substrate 14 and an electrical conductor 18. Generally, the substrate assembly 12 can be used in any application requiring the flow of electrical current and/or electronic signals through the electrical conductor 18. As one example, the electrical conductor 18 can be in the form of a bus bar for supplying electrical current to other structures or devices. In another example, the electrical conductor 18 can be in the form of a wire for carrying electrical or electronic signals from one device to another device. In yet another example, the electrical conductor 18 can form a portion of an electric/electronic or communications network or harness.

The dielectric substrate 14 has a first major surface 20 and an opposing second major surface 22. As shown in FIG. 1, the first major surface 20 and the opposing second major surface 22 are substantially planar. Alternatively, the first major surface 20 and the second major surface 22 can also have substantially non-planar surfaces. As further illustrated in FIG. 1, the first major surface 20 and the second major surface 22 are substantially parallel. In another embodiment, the first major surface 20 and the second major surface 22 can be substantially non-parallel.

Referring again to FIG. 1, the dielectric substrate 14 has major sides, 30a and 30b, and minor sides, 32a and 32b. In the illustrated embodiment, the major sides, 30a and 30b, are substantially parallel to each other. Alternatively, the major sides, 30a and 30b, can be non-parallel to each other. Similarly, in the illustrated embodiment, the minor sides, 32a and 32b, are substantially parallel to each other. Alternatively, the minor sides, 32a and 32b, can be non-parallel to each other.

In the illustrated embodiment, the dielectric substrate 14 is made of a dielectric material, such as for example glass. In the illustrated embodiment, the glass is a heat toughened or tempered glass configured to improve the strength of the substrate assembly 12. Alternatively, the dielectric substrate 14 can be other types of glass, such as for example non-tempered glass. In other embodiments, the dielectric substrate 14 can be strengthened in other manners, such as for example with fiberglass mat or carbon fibers. In other embodiments, the dielectric substrate 14 can be made be made of other dielectric materials, such as for example plastic, ceramics or glass-ceramic materials. In other embodiments, the dielectric substrate 14 can be a laminated assembly having a dielectric top layer, such as for example a photovoltaic material having a metal backing. While the dielectric substrate 14 illustrated in FIG. 1 is shown as a panel, it should be appreciated the dielectric substrate 14 can have other forms, such as for example a coating applied to other structures or assemblies.

While the dielectric substrate 14 illustrated in FIG. 1 is shown as a stand alone panel, it should be appreciated that the dielectric substrate 14 could be attached to other panels, assemblies or structures.

Figure 2:
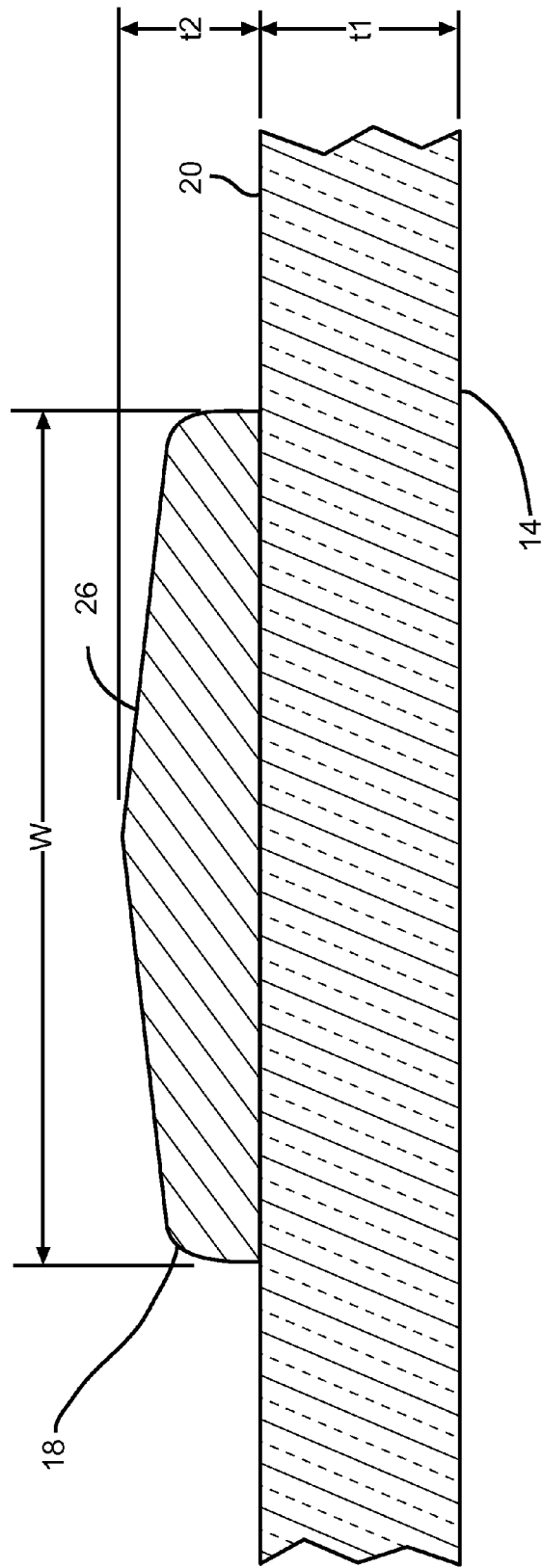
FIG. 2 is a side elevational view of a conductor deposited on a dielectric substrate taken along the line 2-2 of FIG. 1.

Referring now to FIG. 2, the dielectric substrate 14 has a thickness t1. In one embodiment of the dielectric substrate 14, the thickness t1 is in a range from about 0.1 inches (2.54 mm) to about 1.0 inches (25.4 mm). In other embodiments, the thickness t1 can be less than about 0.1 inches (2.54 mm) or more than about 1.0 inches (25.4 mm).

Figure 3:
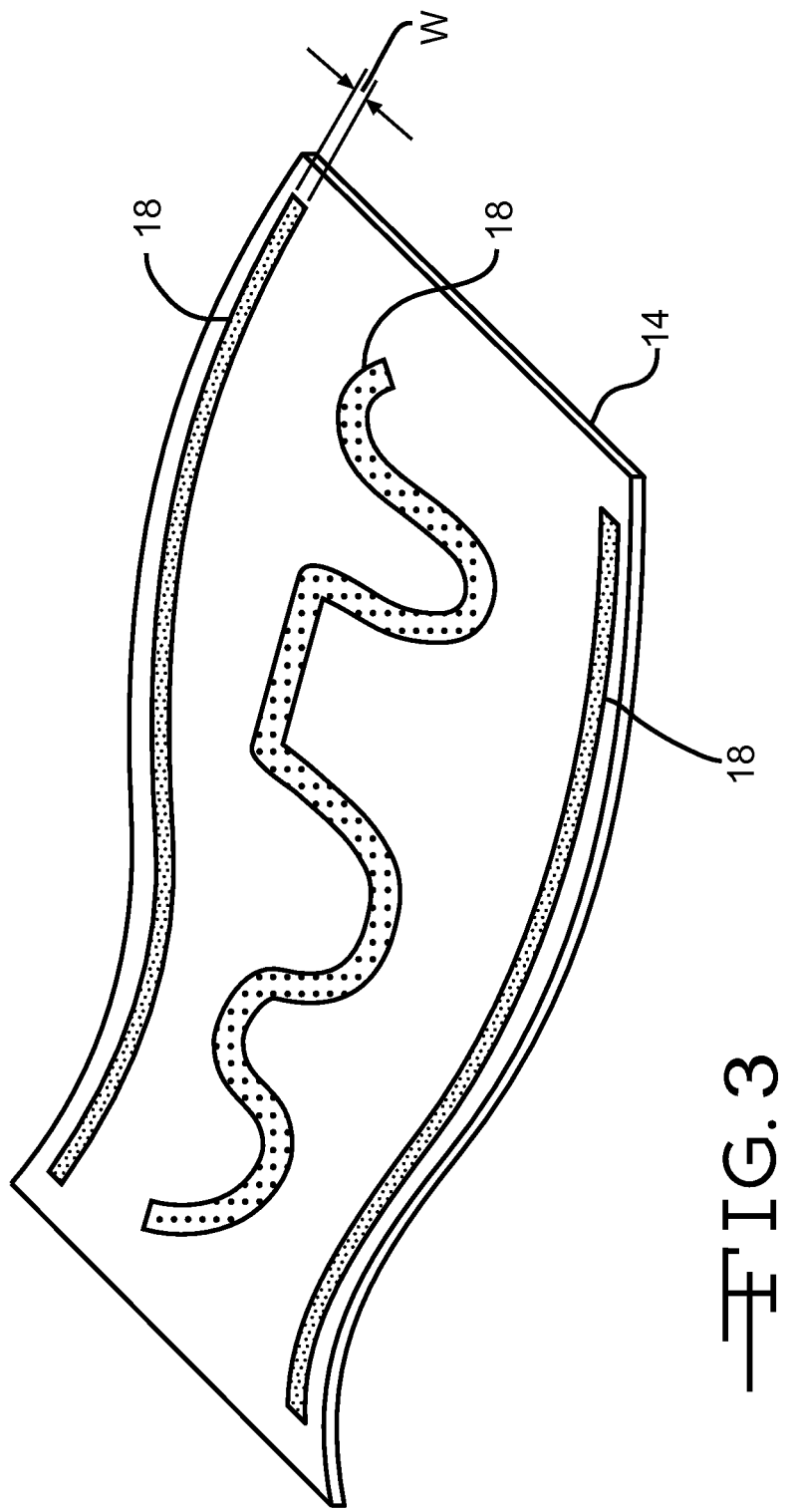
FIG. 3 is a perspective view of non-linear conductors deposited on a dielectric substrate according to the invention.

Referring again to the embodiment illustrated in FIG. 1, the dielectric substrate 14 has a generally rectangular shape with square corners. Alternatively, as shown in FIG. 3, the dielectric substrate 14 can have other shapes. It is within the contemplation of this invention that the dielectric panel 14 can be any geometric shape having any number of sides, including for example oval and circular, and can also have any corner shape, such as for example rounded corners. In other embodiments, the dielectric substrate 14 can have other surface or edge treatments, such as for example, frosted edges.

As shown in FIG. 1, the substrate assembly 12 includes an electrical conductor 18. While the embodiment shown in FIG. 1 illustrates a single electrical conductor 18, it should be understood that more than one electrical conductor can be deposited on the dielectric substrate 14. As shown in the embodiment illustrated in FIG. 3, the electrical conductors 18 can be deposited onto the dielectric substrate 14 in any desired pattern and in desired relationship with each other. As shown in FIG. 3, the electrical conductors 18 can have a straight orientation, a curved orientation, a parallel orientation, a non-parallel orientation and a random pattern orientation.

Referring again to FIG. 1, the electrical conductor 18 is configured to be electrically conductive. In the embodiment shown in FIG. 1, the electrical conductor 18 is made of an electrically conductive material, such as for example zinc. As will be described in more detail below, the electrical conductor 18 is formed from particles of zinc deposited onto the first major surface 20 of the dielectric substrate 14. In other embodiments, the electrical conductor 18 can be made of other electrically conductive materials, such as for example aluminum, brass, copper, any combinations thereof, or any electrically conductive metal alloys. While the embodiment shown in FIG. 1 illustrates a single electrical conductor 18 being made of a certain electrically conductive material, it is within the contemplation of the invention that multiple electrical conductors, each being made of different electrically conductive materials, can be formed.

As shown in FIG. 2, the electrical conductor 18 has a width w and a thickness t2. In the illustrated embodiment, the width w of the electrical conductor 18 is in a range from about 0.060 inch (1.52 mm) to about 0.375 inch (9.53 mm). In other embodiments, the width w of the electrical conductor 18 can be less than 0.060 inch (1.52 mm) or more than 0.375 inch (9.53 mm). Referring again to the embodiment shown in FIG. 3, the width w of each of the electrical conductors 18 is the same. In other embodiments the width w of each of the electrical conductors 18 can be different. While each of the electrical conductors 18 shown in FIG. 3 has a constant width w along the length of the electrical conductors 18, it should be understood that the width w of each of the electrical conductors 18 can vary along the length of each electrical conductor 18. Further, while the dielectric substrate 14 illustrated in FIG. 1 is shown as having a much larger surface area than the electrical conductor 18, it should be appreciated that the dielectric substrate 14 need only have the same width w as the electrical conductor 18.

Referring again to the embodiment shown in FIG. 2, the thickness t2 of the electrical conductor 18 is in a range from about 0.002 inch (0.05 mm) to about 0.030 inch (0.76 mm). In other embodiments, the thickness t2 of the electrical conductor 18 can be less than 0.002 inch (0.05 mm) or more than 0.030 inch (0.05 mm). Referring again to the embodiment shown in FIG. 3, the thickness t2 of each of the electrical conductors 18 is the same. In other embodiments, the thickness t2 of each of the electrical conductors 18 can be different. While each of the electrical conductors 18 shown in FIG. 3 has a constant thickness t2 along the length of each electrical conductor 18, it should be understood that the thickness t2 of each electrical conductor 18 can vary along the length of each electrical conductor 18.

Referring to the embodiment shown in FIGS. 1 and 2, various factors determine the electrical conductivity of the electrical conductor 18. The factors include the material used to form the electrical conductor 18, the thickness t2 of the electrical conductor 18, the width w of the electrical conductor 18 and the porosity of the material used to form the electrical conductor 18. As one example, an electrical conductor 18 having a thickness t2 of 0.030 inch (0.76 mm), a width w of 0.375 inch (9.52 mm) and formed from an alloy of copper and zinc particles, has an electrical conductivity of approximately 0.0050 ohm per foot. Alternatively, the electrical conductivity of the electrical conductor 18 can be more than or less than 0.0050 ohm per foot.

In the embodiment shown in FIG. 2, the electrical conductor 18 has a substantially crownular cross-sectional shape. The crownular cross-sectional shape provides a conductor top surface 26. The conductor top surface 26 provides a surface for attachment of a connector (not shown) to the electrical current source. In one embodiment, the connector can be an electrical wire. In other embodiments, the connector can be another device or mechanism, such as for example a conductive tab. In yet other embodiments, the electrical conductor 18 can have other cross-sectional shapes, such as for example a domed cross-sectional shape, sufficient to provide a surface for attachment of a connector. Referring again to the embodiment shown in FIG. 3, the cross-sectional shape of the electrical conductors 18 is the same. In other embodiments, the cross-sectional shape of the electrical conductors 18 can be different. While each of the electrical conductors 18 shown in FIG. 3 has a constant cross-sectional shape along the length of each electrical conductor 18, it should be understood that the cross-sectional shape of each electrical conductor 18, can vary along the length of each electrical conductor 18.

Referring again to FIG. 1, the electrical conductor 18 is formed by a method of depositing conductive material 29 on the dielectric substrate 14. In the illustrated embodiment, the electrically conductive materials 29 are deposited on the dielectric substrate 14 using a gas dynamic cold spray process. This process is also known under other designations including cold spray, kinetic energy spray or any combination thereof. In this process, a spray gun 28 accelerates the electrically conductive material 29 to supersonic velocities. The kinetic energy of the electrically conductive materials 29, at supersonic velocities, is converted into interfacial heat upon impact with the dielectric substrate 14, thereby producing a combination of mechanical and metallurgical bonding of the electrically conductive materials 29 to the dielectric substrate 14. During the deposition process, the electrically conductive materials 29 are maintained at a relatively low temperature (in a range from about 200° F. to about 400° F.). In the illustrated embodiment, the spray gun 28 uses relatively low pressures (in a range from about 80 psi to 150 psi) of compressed air. In other embodiments, the spray gun 28 can use pressures less than 80 psi or more than 150 psi and can use other gases. The gas dynamic cold spray process has many advantages over alternative thermal deposition methods. First, the electrically conductive materials 29 can be deposited on the dielectric substrate 14 to form an electrical conductor 18 having finely defined lines of demarcation. The finely defined lines of demarcation of the electrical conductor 18 can be formed without the use of a mask to define the spray pattern. By eliminating the use of a mask, the substrate assemblies 12 can be made efficiently. Second, because the electrically conductive materials 29 are maintained in a relatively low temperature, the electrically conductive materials 29 do not melt. Since the electrically conductive materials 29 do not melt, less oxidation of the electrically conductive materials 29 is formed in the deposition process resulting in a higher conductivity of the electrical conductor 18. Third, because the deposited material forming the electrical conductor 18 is at a lower porosity than other low pressure thermal sprays, the conductivity of the electrical conductor 18 is higher. Also, because the electrically conductive materials are maintained in a relatively low temperature, there are less internal stresses introduced from the coefficient of thermal expansion during the spray process providing improved adhesion properties of the electrically conductive material 29. Other benefits of using a gas dynamic cold spray process to manufacture substrate assemblies 12 include elimination of preparatory cleaning of the dielectric substrate 14 prior to the deposition of the electrically conductive material 29, minimum set-up time and expense, elimination of post deposition treatments and cleaning and the potential to accommodate any size and shape of dielectric substrate 14.

Referring again to FIG. 1, the spray gun 28 is configured to deposit the electrically conductive material 29 on the dielectric substrate 14. Optionally, the spray gun 28 can be hand-held or mounted to support mechanisms, such as for example lineal slides, to provide stability in the deposition process. In other embodiments, the movement of the spray gun 28 can be controlled by automated or computer-based controls to further ease the deposition process.

The spray gun 28 includes a spray gun nozzle 31. In the illustrated embodiment, the spray gun nozzle 31 has a convergent-divergent design configured to accelerate the flow of a gas passing through the nozzle to a supersonic speed. The convergent-divergent design of the spray gun nozzle 31 is also known as a "De Laval nozzle". In other embodiments, the spray gun nozzle 31 can have other designs sufficient to accelerate the flow of a gas passing through the nozzle to a supersonic speed. Spray guns are commercially available, such as for example, the SST Model from Centerline Ltd. in Windsor, Ontario. However, other spray guns can be used.

As mentioned above, the electrical conductor 18 is formed on the dielectric substrate 14 by the deposition of electrically conductive material 29 on the dielectric substrate 14. In one embodiment, the dielectric substrate 14 is cleaned prior to the deposition of the electrically conductive material 29 using a suitable cleaner. In the illustrated embodiment, the cleaner is an alcohol-based cleaner. Alternatively, the cleaner can be another material suitable to clean the dielectric substrate 14 prior to the deposition of the electrical conductive material 29.

Referring again to FIG. 1, the spray gun 28 is positioned a distance d1 from the dielectric substrate 14. In one embodiment, the distance d1 is in a range from about 0.25 inch (6.35 mm) to about 0.75 inch (19.05 mm). In other embodiments, the distance d1 can be less than 0.25 inch (6.35 mm) or more than 0.75 inch (19.05 mm). In the illustrated embodiment, a mask (not shown) is not required to define the demarcation lines of the electrical conductor 18. In other embodiments, a mask can be used to define the demarcation lines of the electrical conductor 18. The spray gun 28 deposits the electrically conductive material 29 on the dielectric substrate 14 forming the electrical conductor 18 as previously described.

Optionally, the electrical conductor 18 can be covered by a protective coating (not shown). The protective coating is configured to protect the electrical conductor 18 from environmental conditions, such as humidity, heat, ultra-violet light, etc. In one embodiment, the protective coating is a polymer-based material. In other embodiments, the protective coating can be made of materials, such as for example metals or metallic alloys, sufficient to protect the electrical conductor 18 from environmental conditions.

In the embodiment shown in FIG. 2, the thickness t2 of the electrical conductor 18 is formed from a single conductive layer deposited on the dielectric substrate 14. In other embodiments, the thickness t2 of the electrical conductor 18 can be formed from multiple successive conductive layers deposited on the dielectric substrate 14.

Figure 4:
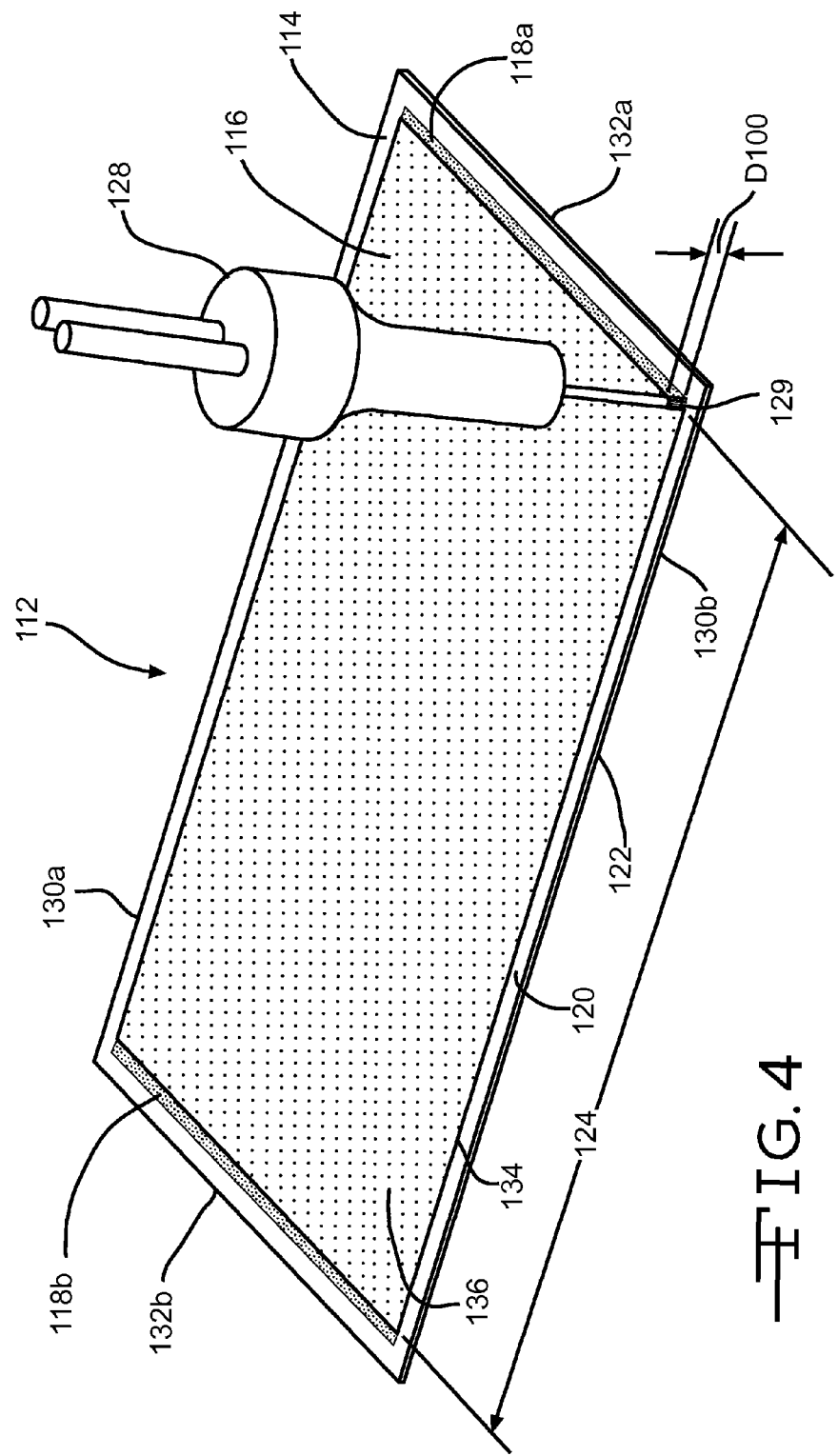
FIG. 4 is a front perspective view of a heated substrate panel assembly according to a first application of the invention.

The method of depositing of electrically conductive material on a dielectric substrate can be used in a variety of applications requiring the flow of electrical current and/or electronic signals through an electrical conductor. One example of an application using this method is a heated substrate panel assembly 112, as shown in FIG. 4. The heated substrate panel assembly 112 has a dielectric substrate 114, a coating layer 116, a first electrical conductor 118a and a second electrical conductor 118b.

As described above, the dielectric substrate 114 has a first major surface 120, an opposing second major surface 122, major sides 130a and 130b, and minor sides 132a and 132b. Also as described above, the dielectric substrate 114 is made of a dielectric material.

Referring again to FIG. 4, the coating layer 116 is applied to the first major surface 120 of the dielectric substrate 14. In the illustrated embodiment, the coating layer 116 is applied to the dielectric substrate 114 by a vacuum deposition technique. One example of a vacuum deposition technique is magnetron sputtering. Alternatively, other vacuum deposition techniques can be used. In other embodiments, the coating layer 116 may be applied to the dielectric substrate 114 by other techniques, such as for example pyrolytically formed by chemical vapor deposition. In yet another embodiment, the coating layer 116 can be carried by a film, such as for example a polyethylene terephthalate (PET) or other plastic sheet material for incorporation in the substrate panel 114.

As further shown in FIG. 4, the coating layer 116 has a substantially rectangular shape that extends substantially to the perimeter edges of the dielectric substrate 114. Alternatively, the coating layer 116 can have other shapes and can extend less than to the perimeter edges of the dielectric substrate 114.

In the embodiment shown in FIG. 4, the coating layer 116 includes at least one metallic layer. In one embodiment, the metallic layer is an infra-red reflective layer. In other embodiments, the metallic layer can be other materials. Optionally, the coating layer 116 can include a sequence of layers, such as for example a conductive layer sandwiched between dielectric layers. In another embodiment, the sequence of layers may include multiple dielectric layers sandwiched with multiple conductive layers. The dielectric layers may comprise, for example, tin oxide, zinc oxide, silicon nitride, titanium oxide, aluminum oxide or mixtures of one or more thereof.

In the embodiment shown in FIG. 4, the coating layer 116 has an electrical resistance in a range from about 2-250 ohms per square. Alternatively, the coating layer 116 can have an electrical resistance that is more than 250 ohms per square or less than 2 ohms per square.

The coating layer 116 shown in FIG. 4 is an electrically conductive material. The coating layer 116 is configured to produce heat when an electric voltage is applied to the coating layer 116. In one embodiment, the electric voltage applied to the coating layer 116 is in a range from about 10 volts to about 440 volts. In another embodiment, the electric voltage applied to the coating layer 116 can be more than 440 volts or less than 10 volts.

In the embodiment shown in FIG. 4, the coating layer 116 is a pyrolitic coating (a hard coat film) and is made of fluorine doped tin oxide. Alternatively, the coating layer 116 can be pyrolitic coating made of other materials, such as for example indium doped tin oxide. In other embodiments, the coating layer 116 can be a vacuum coated coating (a soft coat film). Examples of vacuum coated coatings include zinc oxide, tin oxide and silver oxide.

Referring again to FIG. 4, the coating layer 116 has a first facing 134 and a second facing 136. The first facing 134 and the second facing 136 are on opposing sides of the coating layer 116. In the illustrated embodiment, the first facing 134 of the coating layer 116 is in contact with the first major surface 120 of the dielectric substrate 114.

As shown in FIG. 4, the heated substrate panel assembly 112 includes first and second electrical conductors 118a and 118b. While the embodiment shown in FIG. 4 illustrates a quantity of two electrical conductors, it should be understood that more than two electrical conductors can be used. In the embodiment shown in FIG. 4, the first and second electrical conductors, 118a and 118b, are substantially parallel to each other. In other embodiments, the first and second electrical conductors, 118a and 118b, can be non-parallel to each other.

Referring again to FIG. 4, the first and second electrical conductors, 118a and 118b, are spaced apart a distance to create a heating zone 124. The heating zone 124 can have any desired length and height. While the heated substrate panel assembly 112 illustrated in FIG. 4 shows one substantially rectangular heating zone 124 extending between the substantially parallel first and second electrical conductors, 118a and 118b, it should be understood that any number of heating zones can be created, having any shape, using a plurality of electrical conductors in both parallel and non-parallel configurations. One example of non-parallel electrical conductors is shown in FIG. 3.

Referring again to FIG. 4, the first and second electrical conductors, 118a and 118b, are configured to introduce electrical current to the coating layer 116. While in the embodiment shown in FIG. 4, the first and second electrical conductors 118a and 118b, are made of the same electrically conductive material, it should be understood that each of the first and second electrical conductors, 118a and 118b, could be made of different electrically conductive materials. The electrical conductors, 118a and 118b, have a width, a thickness, an electrical conductivity and a cross-sectional shape as described above.

Referring again to FIG. 4, the electrical conductors, 118a and 118b, are formed by depositing electrically conductive material 129 on the dielectric substrate 114, through the coating layer 116 using the gas dynamic cold spray process as described above. In one embodiment, the electrically conductive material 129 is deposited on the second facing 136 of the coating layer 116 and the electrically conductive material 129 penetrates the coating layer 116 and is deposited on the dielectric substrate 114.

As mentioned above, the electrical conductors, 118a and 118b, are formed on the dielectric substrate 114 by providing a dielectric substrate 114 having a pre-applied coating layer 116. In one embodiment, the dielectric substrate 114 and the coating layer 116 can be cleaned prior to the deposition of the electrical conductors using a suitable cleaner. Alternatively, the dielectric substrate 114 and the coating layer 116 may not need cleaning prior to the deposition of the electrical conductors.

Referring again to FIG. 4, the spray gun 128 is positioned a distance D100 from the dielectric substrate 114. In the illustrated embodiment and as described above, the distance D100 is in a range from about 0.25 inch (6.35 mm) to about 0.75 inch (19.05 mm). In the illustrated embodiment, a mask (not shown) is not required to define the demarcation lines of the electrical conductors 118a and 118b. In other embodiments, a mask can be used to define the demarcation lines of the electrical conductors 118a and 118b. The spray gun 128 deposits the electrically conductive material 129 on the dielectric substrate 114, through the coating layer 116. Optionally, the electrical conductors, 118a and 118b, can be covered by a protective coating as described above. In the embodiment shown in FIG. 4, the electrical conductors, 118a and 118b, can be formed from a single electrically conductive layer deposited on the dielectric substrate 114 or the electrical conductors, 118a and 118b, can be formed from multiple successive electrically conductive layers deposited on the dielectric substrate 114.

Figure 5:
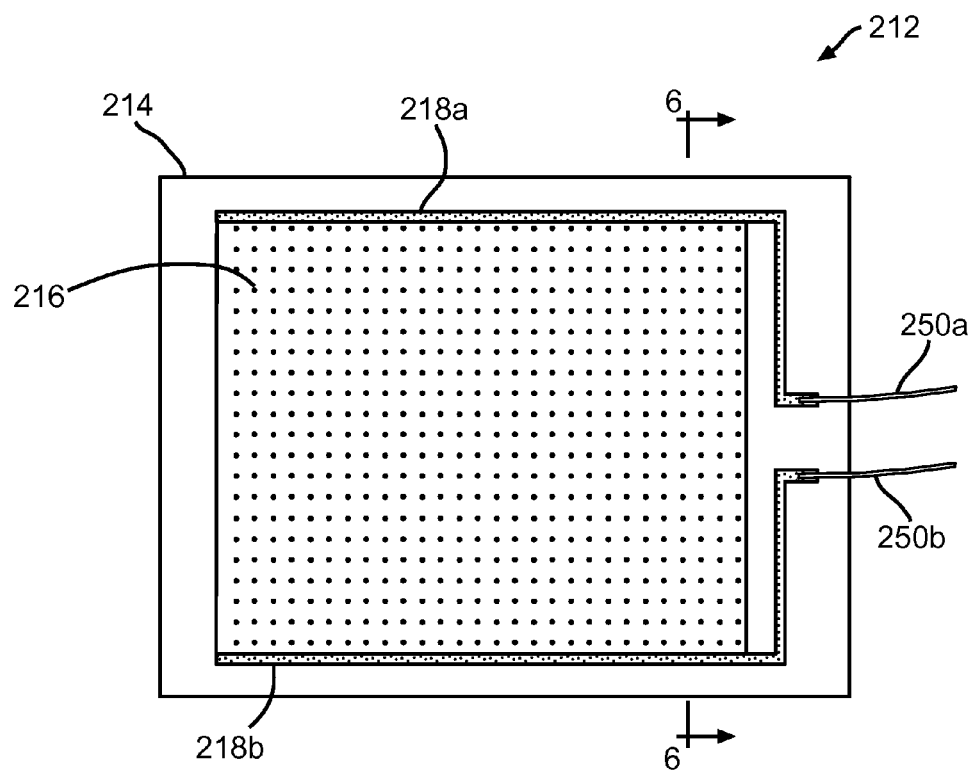
FIG. 5 is a plan view of second application of the invention illustrating a laminated panel assembly.
Figure 6:
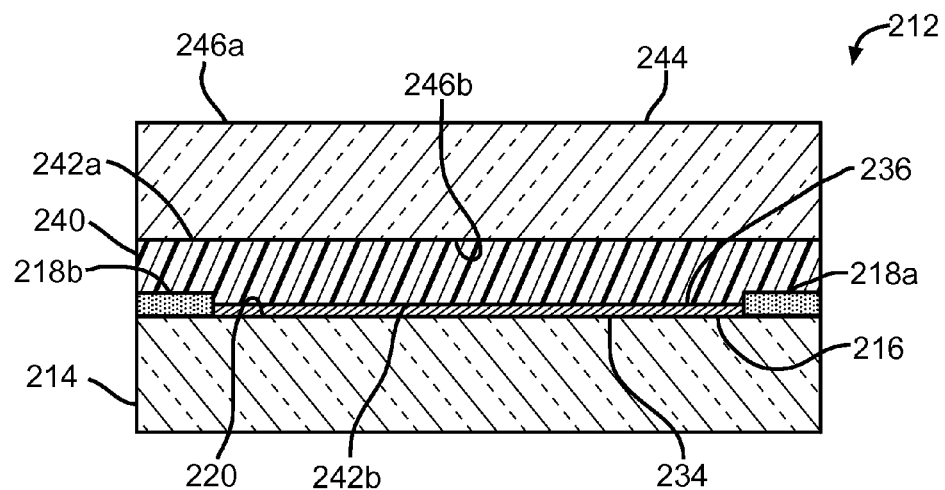
FIG. 6 is a side elevational view of the laminated panel assembly of FIG. 5 taken along the line 6-6 of FIG. 5.

Another example of an application using the method of depositing electrically conductive material on a dielectric substrate is the laminated panel assembly, indicated generally at 212, as shown in FIGS. 5 and 6. In the illustrated embodiment, the laminated panel assembly 212 is a panel assembly having at least one electrically conductive layer deposited on a dielectric substrate 214 and sandwiched between layers of protective materials. As shown in FIG. 6, the laminated panel assembly 212 includes a dielectric substrate 214, a coating layer 216, electrical conductors 218a and 218b, an interlayer 240 and a top plate 244.

In the embodiment shown in FIGS. 5 and 6, the dielectric substrate 214 corresponds to the dielectric substrate 14 shown in FIGS. 1 and 2. Similarly, the coating layer 216 and the electrical conductors, 218a and 218b, corresponds to the coating layer 16 and the electrical conductor 18 shown in FIGS. 1 and 2. The coating layer 216 has a first facing 234 and a second facing 236. The first facing 234 and the second facing 236 of the coating layer 216 correspond to the first facing 134 and the second facing 136 of the coating layer 116 shown in FIG. 4.

Referring again to FIGS. 5 and 6, the first major surface 220 corresponds to the first major surface 20 shown in FIGS. 1 and 2. The coating layer 216 is applied to the first major surface 220 of the dielectric substrate 214, and the electrical conductors, 218a and 218b, are deposited on the dielectric substrate 214 in the same manner as described above in FIG. 4 for the coating layer 116, the dielectric substrate 114 and the electrical conductors, 118a and 118b.

As shown in FIG. 6, the top plate 244 includes a first top plate surface 246a and a second top plate surface 246b. An interlayer 240 is positioned between the second facing 236 of the coating layer 216 and the second top plate surface 246b of the top plate 244. The interlayer 240 is configured to bond the combination of the coating layer 216 and the dielectric substrate 214 to the top plate 244 and simultaneously insulate the conductors, 218a and 218b, from the top plate 244. The interlayer 240 is configured to keep the combination of the coating layer 216 and the dielectric substrate 214 bonded to the top plate 244 in the event either the top plate 244 or the dielectric substrate 214 is broken. The high strength of the interlayer 240 is configured to prevent the combination of the coating layer 216 and the dielectric substrate 214 and the top plate 244 from breaking up into large sharp and/or sharp pieces. The laminated substrate panel assembly 212 can be formed into a laminated assembly in any suitable manner.

In the embodiment shown in FIGS. 5 and 6, the interlayer 240 is made of a dielectric, polymer-based material, such as for example polyvinyl butyral (PVB). In other embodiments, the interlayer 240 can be made of other materials sufficient to prevent the combination of the coating layer 216 and the dielectric substrate 214 and the top plate 244 from breaking up into large sharp and/or sharp pieces and simultaneously insulate the electrical conductors, 218a and 218b, from the top plate 244. The interlayer can have any suitable thickness.

As described above, the top layer 244 has a first top plate surface 246a and an opposing second top plate surface 246b. As shown in FIG. 6, the first top plate surface 246a and the opposing second top plate surface 246b are substantially planar. Alternatively, the first top plate surface 246a and the second top plate surface 246b can also have substantially non-planar surfaces. As further illustrated in FIG. 6, the first top plate surface 246a and the second top plate surface 246b are substantially parallel. In another embodiment, the first top plate surface 246a and the second top plate surface 246b can be substantially non-parallel.

In the illustrated embodiment, the top plate 244 is made of a dielectric material, such as for example glass. In the illustrated embodiment, the glass is a heat toughened or tempered glass configured to improve the strength of the heated substrate panel assembly 212. Alternatively, the top plate 244 can be other types of glass, such as for example non-tempered glass. In other embodiments, the top plate 244 can be strengthened in other manners, such as for example with fiberglass mat or carbon fibers. In other embodiments, the top plate 244 can be made be made of other dielectric materials, such as for example plastic, ceramics or glass-ceramic materials. In other embodiments, the top plate 244 can be a laminated assembly having a dielectric top layer, such as for example a photovoltaic material having a metal backing. In other embodiments, the top plate 244 can be an electrically conductive material. The top plate 244 can have any suitable thickness.

In the embodiment illustrated in FIG. 5, the laminated panel assembly 212 has a generally rectangular shape with square corners. Alternatively, the laminated panel assembly 212 can have other shapes. It is within the contemplation of this invention that the laminated panel assembly 212 can be any geometric shape having any number of sides, including for example oval and circular, and can also have any corner shape, such as for example rounded corners.

Referring again to FIG. 5, one end of electrical connectors, 250a and 250b, is connected to the electrical conductors, 218a and 218b, respectively. The electrical connectors, 250a and 250b, are connected to the electrical conductors, 218a and 218b, in any suitable manner, such as for example soldering or brazing. The other ends of the electrical connectors, 250a and 250b, are connected to a suitable power supply (not shown). The connectors, 250a and 250b, can be any suitable electrically conductive device, such as for example stranded, solid wire or conductive tabs.

Figure 7:
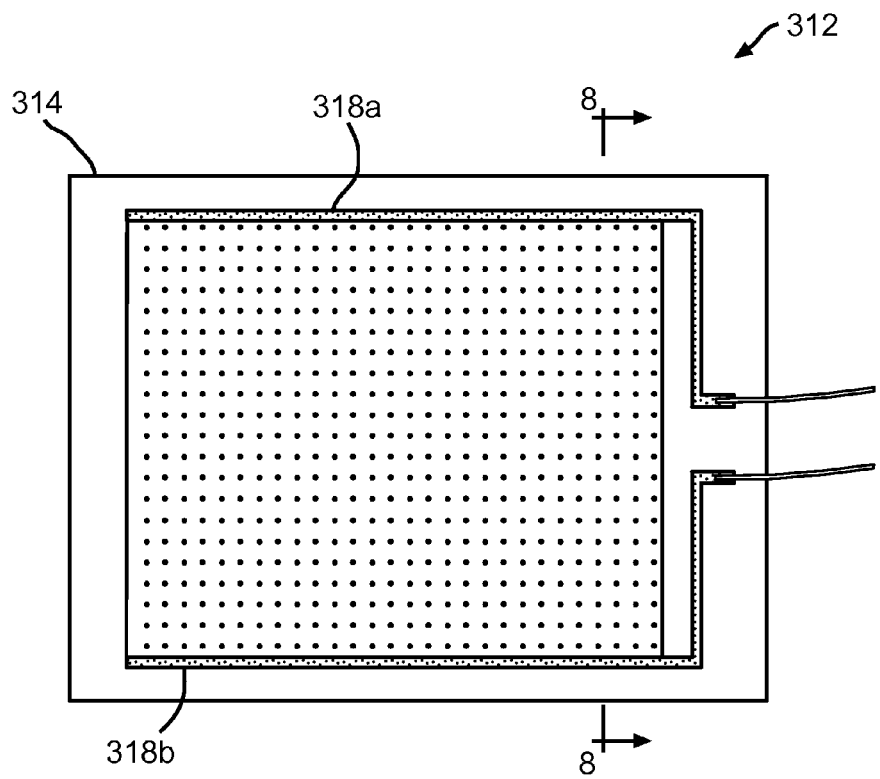
FIG. 7 is a plan view of third application of the invention illustrating a laminated panel.
Figure 8:
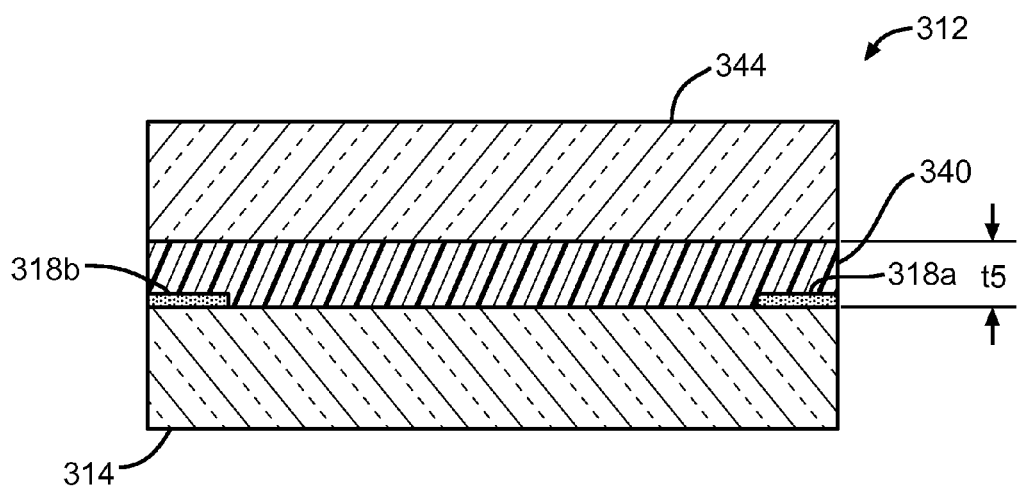
FIG. 8 is a side elevational view of the laminated panel assembly of FIG. 7 taken along the line 8-8 of FIG. 7.

Another example of an application using the method of depositing electrically conductive material on a dielectric substrate is the laminated panel assembly, indicated generally at 312, as shown in FIGS. 7 and 8. The laminated panel assembly 312 is the same as the laminated panel assembly 212 illustrated in FIGS. 5 and 6 with the exception that there is no coating layer. In this embodiment, the interlayer 340 is electrically conductive. In one embodiment, the interlayer 340 can be made of material that is made to be electrically conductive by inclusion of an electrical conductor, such as for example a wire, positioned throughout the interlayer 340. In other embodiments, the interlayer 340 can be made of suitable polymer materials having electrically conductive properties.

As shown in FIG. 8, electrical conductors, 318a and 318b, are deposited on the dielectric substrate 314. The interlayer 340 is positioned between the dielectric substrate 314 and a top plate 344. The interlayer 340 is configured to bond the dielectric substrate 314 to the top plate 344 and simultaneously be in direct electrical contact with electrical conductors 318a and 318b. The interlayer 340 is configured to produce heat when an electric voltage is applied to the interlayer 340 through the electrical conductors, 318a and 318b. In one embodiment, the electric voltage applied to the interlayer 340 is in a range from about 10 volts to about 440 volts. In another embodiment, the electric voltage applied to the interlayer 340 can be more than 240 volts or less than 10 volts.

While the invention as been described with reference to particular embodiments, it should be understood that various changes may be made and equivalents may be substituted for elements thereof without departing from the essential scope of the invention. In addition, many modifications may be made to adapt a particular situation or material to the teachings of the invention without departing from the essential scope thereof. Therefore, it is intended that the invention not be limited to the particular embodiments, but that the invention shall include all embodiments falling within the scope of the claims.

I claim:

1. A method of depositing electrically conductive material onto a glass substrate, the method comprising the steps of:
   providing a glass substrate having an electrically conductive coating capable of producing heat when an electric voltage is applied thereto having an electrical resistance of from 2 to 250 ohms per square on at least a portion thereof; and
   depositing electrically conductive material onto the glass substrate using a cold spray gas dynamic process, wherein the cold spray gas dynamic process accelerates the electrically conductive material to a supersonic velocity, and the deposited electrically conductive material contacts the electrically conductive coating.

2. The method of claim 1, wherein the cold spray gas dynamic process uses a spray gun.

3. The method of claim 2, wherein the spray gun has a convergent-divergent nozzle.

4. The method of claim 1, wherein the deposited electrically conductive material forms an electrical conductor for conducting electrical current through the electrically conductive coating.

5. The method of claim 4, wherein the deposited electrically conductive material is formed without the use of a spray mask.

6. The method of claim 1, wherein the glass substrate has non-planar major surfaces.

7. The method of claim 1, wherein the glass substrate has non-parallel major surfaces.

8. The method of claim 1, wherein the glass substrate further comprises a metal backing.

9. The method of claim 4, wherein the deposited electrically conductive material has a curved orientation.

10. The method of claim 1, wherein the deposited electrically conductive material is zinc.

11. The method of claim 9, wherein the deposited electrically conductive material has a width and a length, wherein the width varies along the length of the electrical conductor.

12. The method of claim 4, wherein the deposited electrically conductive material has a crownular cross-sectional shape.

13. The method of claim 1, wherein the deposited electrically conductive material is maintained within a temperature range of 200° F. to 400° F. during the depositing step.

14. The method of claim 1, wherein the cold spray gas dynamic process uses compressed air.

15. The method of claim 14, wherein the compressed air has a pressure in a range of from 80 psi to 150 psi.

16. The method of claim 4, wherein the deposited electrically conductive material is fanned by multiple successive layers deposited on the glass substrate.

17. The method of claim 4, wherein the deposited electrically conductive material is covered by a protective coating.

18. The method of claim 1, wherein the deposited electrically conductive material forms an electrically conductive wire.

19. The method of claim 18, wherein the wire forms a portion of an electrical harness.

20. The method of claim 1, wherein the deposited electrically conductive material carries electronic signals.

21. A method of manufacturing a heated substrate panel assembly comprising the steps of:
providing a glass substrate;
applying an electrically conductive pyrolitic coating layer to the glass substrate having an electrical resistance of from 2 to 250 ohms per square; and
depositing electrical conductors onto the electrically conductive coating layer by using a cold spray gas dynamic process, the electrical conductors creating a heating zone in a region of the electrically conductive coating located between the electrical conductors.

22. The method of claim 21, wherein an interlayer is positioned between the coated layer and a top plate.

23. The method of claim 21, wherein the electrical conductors are deposited on the electrically conductive coating layer without the use of a mask.

* * * * *